United States Patent
Onishi et al.

[11] Patent Number: 5,498,575
[45] Date of Patent: Mar. 12, 1996

[54] BONDING FILM MEMBER AND MOUNTING METHOD OF ELECTRONIC COMPONENT

[75] Inventors: Hiroaki Onishi, Higashiosaka; Kenichiro Suetsugu, Nishinomiya, both of Japan

[73] Assignee: Matsushita Electric Industrial Co., Ltd., Osaka, Japan

[21] Appl. No.: 263,382

[22] Filed: Jun. 22, 1994

[30] Foreign Application Priority Data

Jun. 23, 1993 [JP] Japan ................. 5-151677

[51] Int. Cl.⁶ ........................................ H01L 21/60
[52] U.S. Cl. ................ 437/209; 437/206; 437/211; 437/214; 437/217; 437/219; 437/220
[58] Field of Search ................. 437/206, 208, 437/209, 211, 214, 217, 218, 219, 220

[56] References Cited

U.S. PATENT DOCUMENTS

| | | |
|---|---|---|
| 4,839,713 | 6/1989 | Teraoka et al. |
| 4,927,491 | 5/1990 | Masaki ............... 437/206 |
| 4,990,462 | 2/1991 | Sliwa, Jr. ............ 437/208 |
| 5,053,357 | 10/1991 | Lin et al. ............ 437/211 |
| 5,064,706 | 11/1991 | Ueda et al. ......... 437/206 |
| 5,303,120 | 4/1994 | Michii et al. ....... 361/760 |
| 5,309,021 | 5/1994 | Shimamoto et al. .... 257/691 |

FOREIGN PATENT DOCUMENTS 3-151162  6/1991  Japan .

*Primary Examiner*—Brian E. Hearn
*Assistant Examiner*—Kevin M. Picardat
*Attorney, Agent, or Firm*—Wenderoth, Lind & Ponack

[57] ABSTRACT

A method of mounting electronic components on circuit boards, which includes the steps of obtaining a bonding film member by filling bonding material into openings in a predetermined pattern of an electrically-insulating and heat-proof film and holding the bonding material in the openings by a flux layer laminated on one surface of the film, overlaying the bonding material of the bonding film member onto conductive layers of a circuit board by supplying the bonding film member onto the circuit board, superposing electrodes of electronic components onto the bonding material of the bonding film member by supplying the electronic components onto the bonding film member, and melting the bonding material by heating the circuit board.

16 Claims, 12 Drawing Sheets

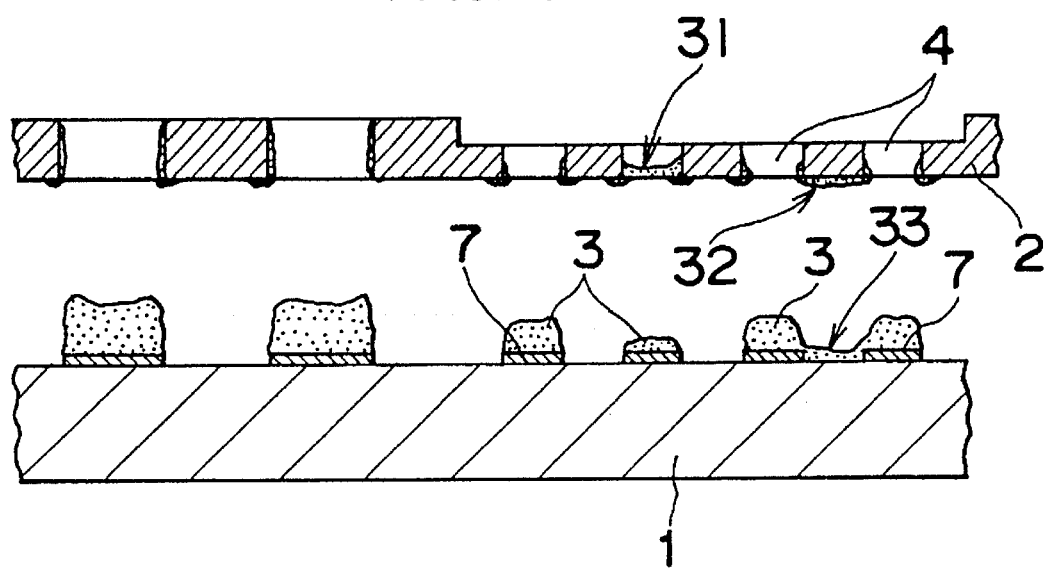

BONDING FILM MEMBER AND MOUNTING METHOD OF ELECTRONIC COMPONENT

BACKGROUND OF THE INVENTION

The present invention relates to a bonding film member of a film structure for bonding an electronic component onto a circuit board by supplying bonding material such as cream solder or the like onto land-shaped conductive layers of the circuit board, and a method for mounting electronic components onto the circuit board with the use of the bonding film member.

In order to mount a Quad Flat Package (QFP), e.g., an IC or a chip onto a circuit board, generally, cream solder is preliminarily printed on land-shaped conductive layers of the circuit board in a printing process, and leads of the electronic component are overlayed onto the cream solder in a setting process, and then the circuit board is heated to melt the cream solder in a reflow process.

The aforementioned processes will be explained more in detail with reference to the corresponding drawings.

In the printing process, as shown in FIG. 15, a metallic mask 2 is set on a circuit board 1, onto which cream solder 3 is supplied. When a squeegee 5 is moved in a direction of an arrow 6, the cream solder 3 is filled in the form of a film into openings 4 of the mask 2 formed in a predetermined pattern. The printing process is completed when the mask 2 is removed. In consequence, a layer of the cream solder 3 is formed on land-shaped conductive layers 7 of the circuit board 1 as indicated in FIG. 16.

Referring to FIG. 17, in the setting process, leads 100 and 10 of electronic components 90 and 9 which are transferred onto the circuit board 1 by means of a suction nozzle 8 are placed on the cream solder 3. Because of the adhesive force of the cream solder 3, the electronic components 90 and 9 are combined with the circuit board 1 via the cream solder 3, and then sent to the reflow process.

In the reflow process shown in FIG. 18, the circuit board 1 is heated by a heat source such as a hot wind or an infrared heater, etc. As a result of this heating, the cream solder 3 is melted, so that the leads 100 and 10 of the electronic components 90 and 9 are soldered and bonded to the conductive layers 7 of the circuit board 1, as in FIG. 19.

In accordance with the recent tendency toward more compact and higher-density electronic components, the pitch of the leads is increasingly narrowed and consequently, the size and the pitch of openings formed in the mask used in the above printing process are also reduced. As a result, when the mask is removed, it often takes place that the cream solder is partly left in the openings of the mask without being completely printed on the circuit board as shown by reference numeral 31 in FIG. 16, or part of the cream solder penetrates under the mask as shown by reference numeral 32 in FIG. 16. If such an undesirable accident is brought about in printing of the cream solder in a super fine pattern, blurs and bridges of the cream solder may be generated as shown by 33 and bonding becomes poor in the reflow process, causing shortcircuits and the like.

Meanwhile, the suction nozzle carrying the electronic components onto the circuit board may become inclined when pressing the electronic components against the circuit board, and therefore the cream solder may become deformed and spread in the widthwise direction of the conductive layers.

When the circuit board is heated in the reflow process, the flux of the cream solder is softened and comes out beyond the conductive layers. The shape of the cream solder is readily deformed, that is, sagging can easily occur.

As mentioned hereinabove, the defective bonding due to the insufficiency or deformation of the cream solder is induced not only in the printing process, but in the setting process and reflow process. Therefore, it is not easy to highly accurately mount the electronic components on the circuit board, particularly when the leads of the electronic components are arranged with a narrow pitch.

Some QFPs nowadays are arranged with pitches of their leads as small as 0.3 mm. A metallic mask of about 0.15 mm thickness is used in the printing process to mount QFPs with a 0.5 mm pitch of the leads or chip parts of 1.0 mm×0.5 mm size on circuit boards. Since the printing thickness is determined by the thickness of the mask, the printing amount, namely, the amount of the solder is regulated only by the size of the openings. However, the solder is required to be so little in mounting QFPs of 0.3 mm pitch of the leads that the reduction of the size of the openings cannot meet the situation. Moreover, the solder becomes short for the other existing components on the same circuit board if the mask is made thinner.

The necessary amount of the solder is different between the electronic components of a narrower pitch and the other existing components. As the difference is lately increasing more and more, a metallic mask of uniform thickness is not fit for every kind of printing. Although the half-processed mask, the thickness of which is partially changed as illustrated in FIG. 15, has been put to trial, the printing amount of the cream solder is actually irregular, and the cream solder blurs or bridges are generated, similar to the prior art.

SUMMARY OF THE INVENTION

The object of the present invention is therefore to provide a bonding film member which can easily supply an appropriate amount of bonding material to each bonding portion without causing defective bonding, e.g., a shortcircuit or a shortage of solder, and a mounting method of electronic components using the bonding film member.

In accomplishing these and other objects, according to one aspect of the present invention, there is provided a method of mounting electronic components on circuit boards, which comprises the steps of:

obtaining a bonding film member by filling bonding material into openings in a predetermined pattern of an electrically-insulating and heat-proof film and holding the bonding material in the openings by a flux layer laminated on one surface of the film;

overlaying the bonding material of the bonding film member onto conductive layers of a circuit board by supplying the bonding film member onto the circuit board;

superposing electrodes of electronic components onto the bonding material of the bonding film member by supplying the electronic components onto the bonding film member; and melting the bonding material by heating the circuit board.

BRIEF DESCRIPTION OF THE DRAWINGS

These and other objects and features of the present invention will become clear from the following description taken in conjunction with the preferred embodiments thereof with reference to the accompanying drawings, in which:

FIG. 16 is a side sectional view of a conventional circuit board after cream solder is printed thereon;

DETAILED DESCRIPTION OF THE PREFERRED EMBODIMENTS

Figure 1:
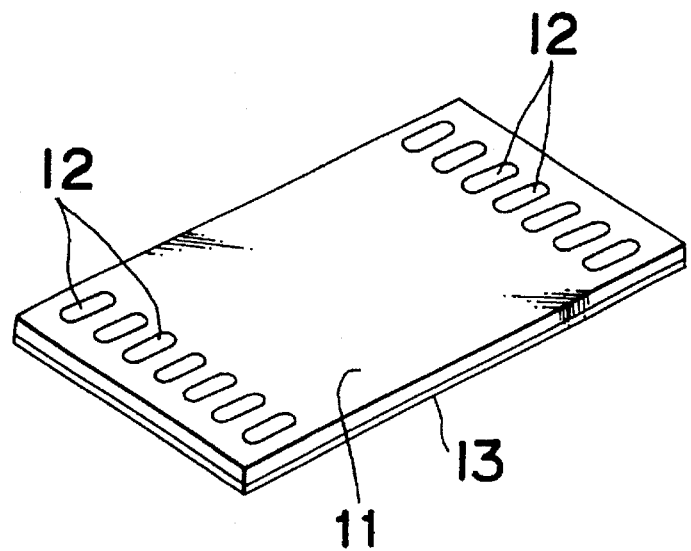
FIG. 1 is a perspective view of a bonding film member before being filled with bonding material, in a first embodiment of the present invention.

Before the description of the present invention proceeds, it is to be noted that like parts are designated by like reference numerals throughout the accompanying drawings.

Preferred embodiments of the present invention will be described with reference to the accompanying drawings.

Figure 2:
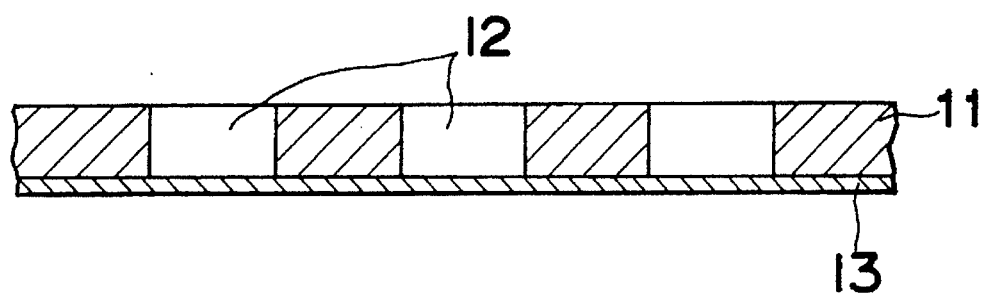
FIG. 2 is a side sectional view of the bonding film member of FIG. 1.

A film 11 shown in FIGS. 1 and 2 has electrically insulating and heat-proof properties to preferably resist a temperature of at least 230° C. and is a sheet formed of synthetic resin such as polyimide. Openings 12 are bored in a predetermined pattern in the film 11. The material of the film 11 preferably has a heat-proof property to resist a temperature of at least 183° C. when eutectic solder having a melting temperature of 183° C. is used for bonding material. That is, the material of the film 11 preferably has a heat-proof property to resist a melting temperature of the solder which is used as a bonding material. A flux sheet 13 for forming a flux layer is attached to the rear face of the film 11 by thermocompression bonding or pressure bonding or the like.

Figure 3:
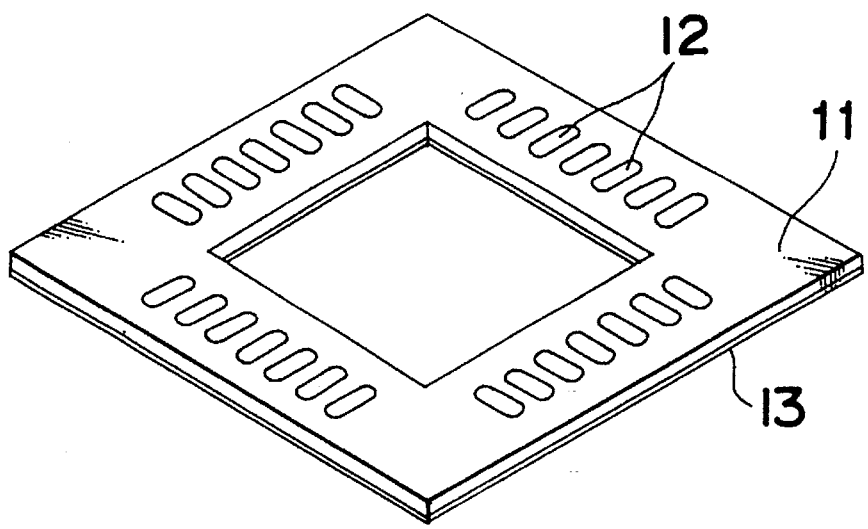
FIG. 3 is a perspective view of a bonding film member before being filled with bonding material, in a further embodiment of the present invention.

The openings 12 are formed, for instance, by etching, laser processing or the like. The pattern of the openings 12 corresponds to a land-shape in which conductive layers 7 are spaced apart on a circuit board 1. The thickness of the film 11 is selected in accordance with the amount of bonding material to be supplied onto the conductive layers 7 of the circuit board 1. In FIG. 3, the film 11 is formed in the shape of a picture frame, and more specifically, the central part of the film 11 where a main body of the electronic component is accommodated is cut out. Therefore, even if there is not a sufficient gap between the main body of the electronic component mounted on the circuit board and the circuit board, in other words, the standoff of the component is small in height, the electronic component is prevented from touching the film and thus being lifted.

Figure 4:
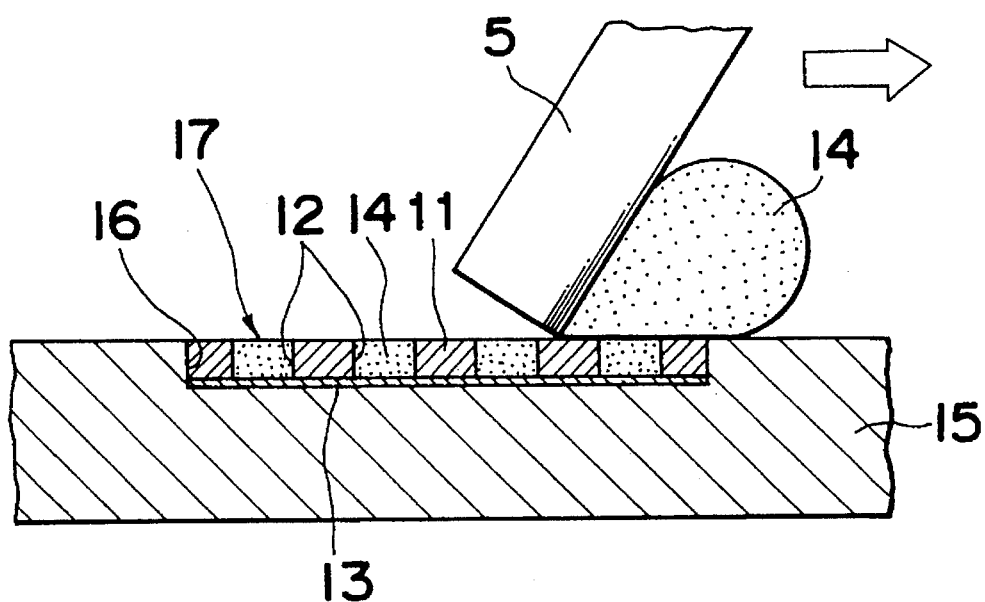
FIG. 4 is a side sectional view of the bonding film member, in the first embodiment of the present invention, being filled with bonding material.
Figure 5:
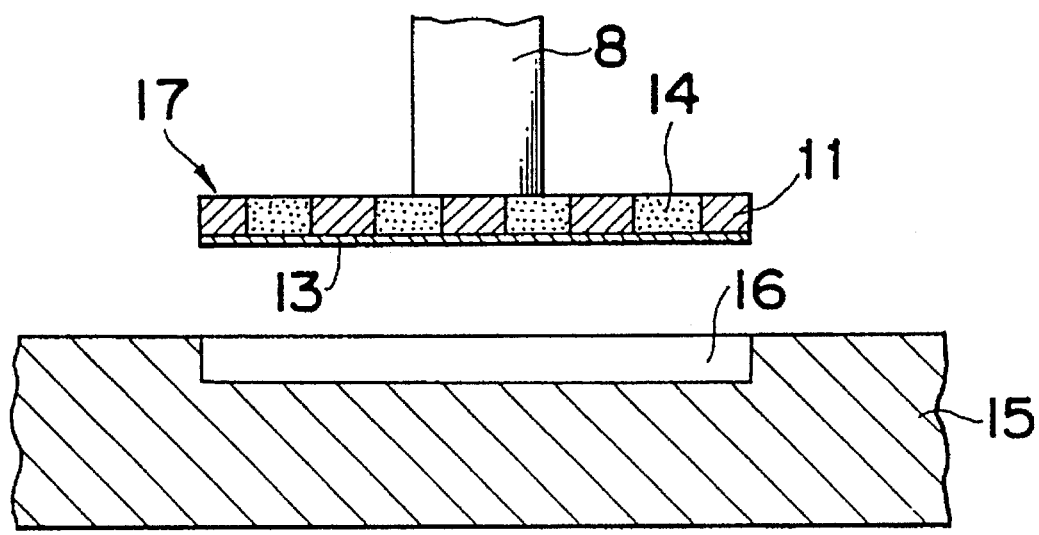
FIG. 5 is a side sectional view of the bonding film member being transferred, in the first embodiment.

As indicated in FIG. 4, cream solder 14 as the bonding material is filled into the openings 12 of the film 11. The film 11 is set in a recess 16 of a processing stage 15. The cream solder 14 is pressed by a squeegee 5 into the openings 12, similar to the printing process described earlier. A bonding film member 17 is thus completed. The finished bonding film member 17 is removed from the recess 16 by a suction nozzle 8, as shown in FIG. 5.

Now, an embodiment partly employing a conventional printing method using a mask will be described referring to FIGS. 6–12. FIG. 12 is a flow chart showing an overall method of mounting the electronic components 90 and 9 on the circuit board 1 according to the first embodiment of the present invention.

Figure 6:
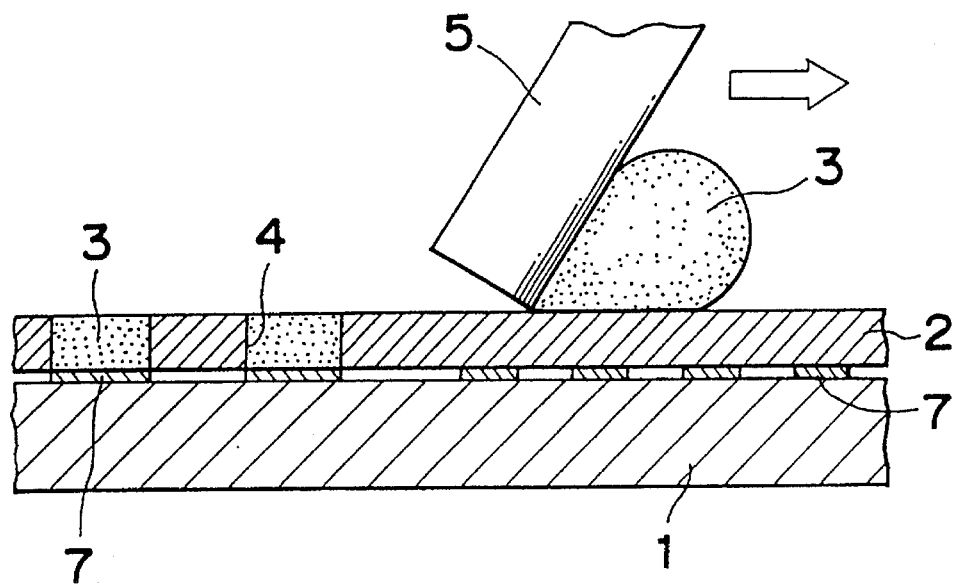
FIG. 6 is a side sectional view of a printing process of cream solder.
Figure 7:
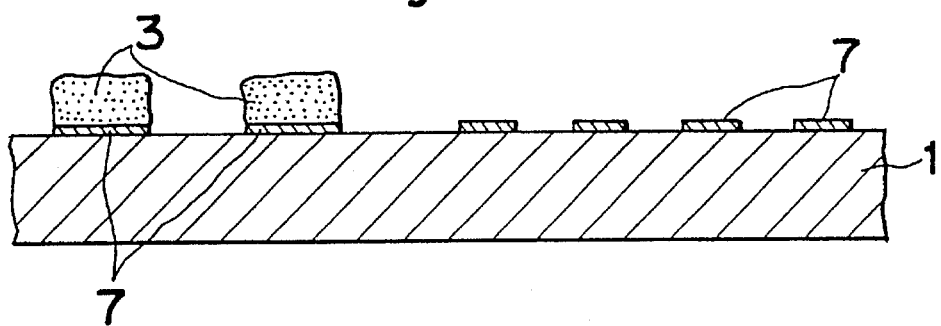
FIG. 7 is a side sectional view of a circuit board after the cream solder is printed thereon.
Figure 8:
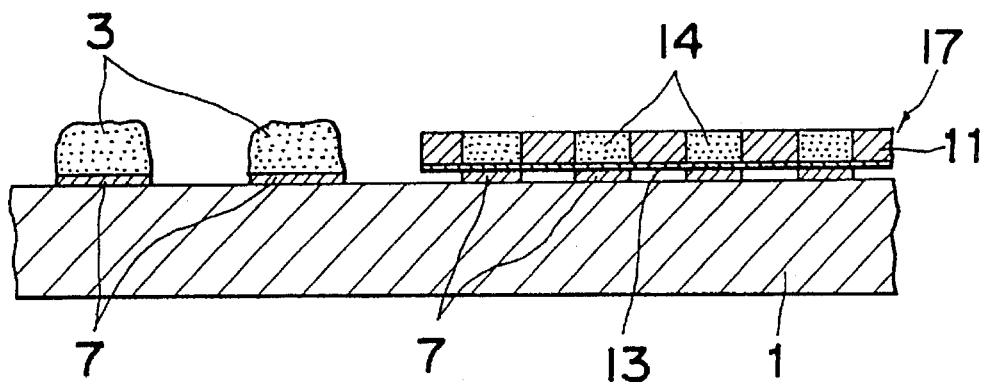
FIG. 8 is a side sectional view of a circuit board having the bonding film member of the first embodiment thereon.

A mask 2 is set on the circuit board 1, as in FIG. 6. The mask 2 has openings 4 formed only in an area where an electronic component 90 with a relatively large arranging pitch of leads, i.e. electrodes, 100 is to be mounted. No openings are provided in the remaining area of the mask 2. After the cream solder 3 is pressed into the openings 4 of the mask 2 by the squeegee 5 as step #1 in FIG. 12, the mask 2 is removed, whereby printing is finished. As shown in FIG. 7, layers of the cream solder 3 are hence obtained on the conductive layers 7 of the circuit board 1.

Figure 9:
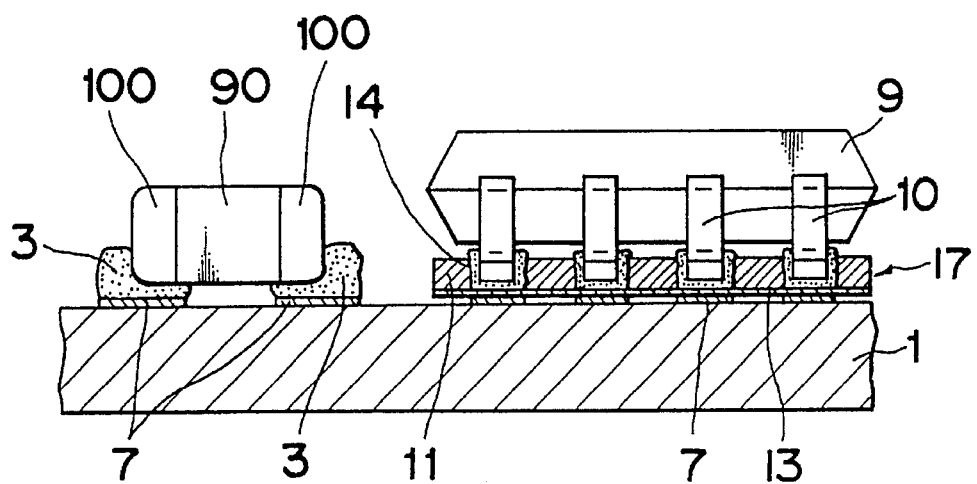
FIG. 9 is a side sectional view of the circuit board of FIG. 8 when electronic components are mounted thereon.
Figure 10:
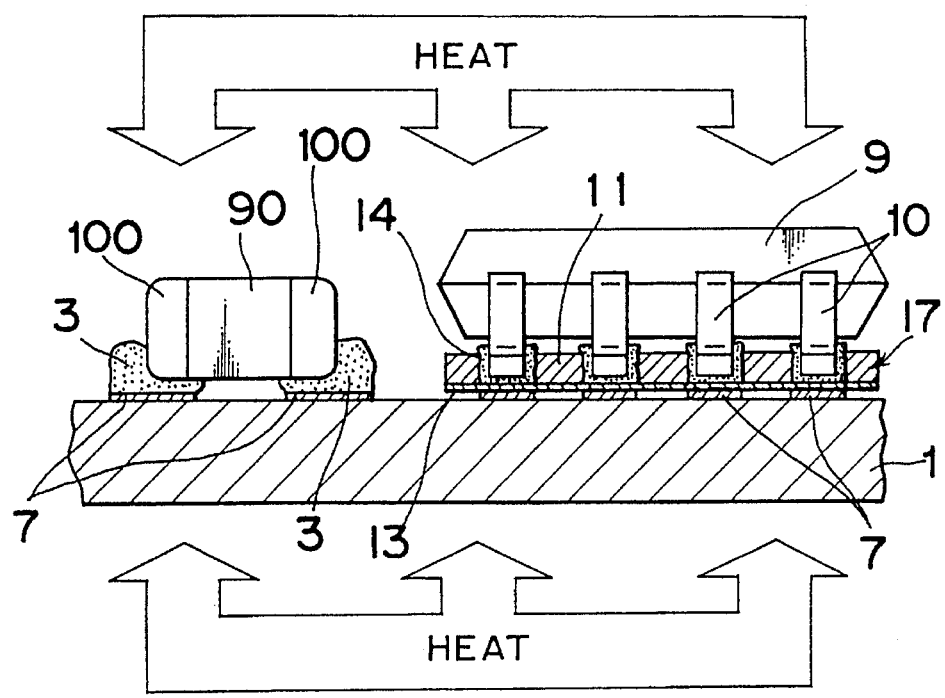
FIG. 10 is a side sectional view of the circuit board in FIG. 9 in a reflow process.
Figure 13:
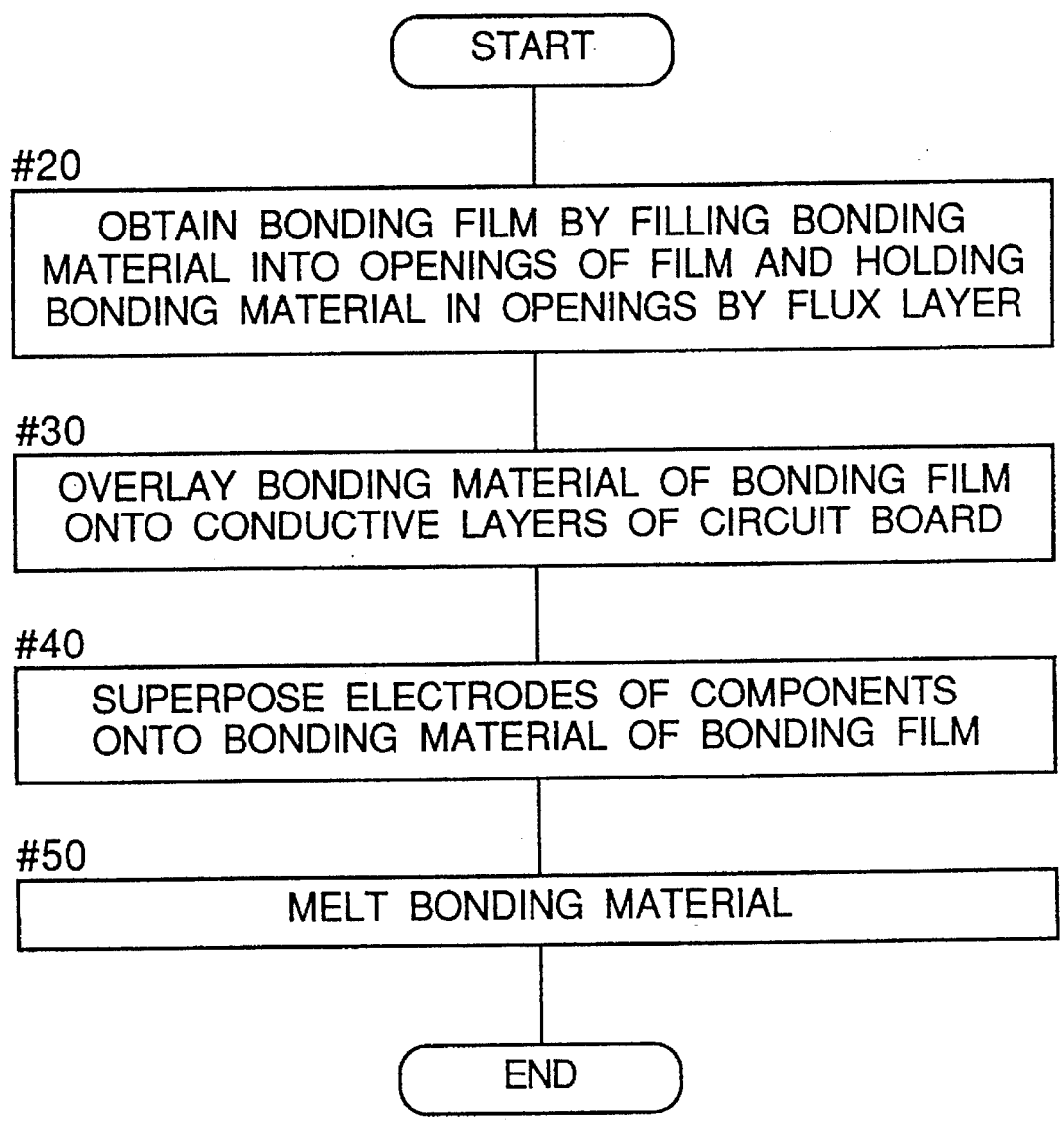
FIG. 13 is a flow chart showing a method of mounting an electronic component with electrodes of a narrow pitch on a circuit board in the method in FIG. 12.

Thereafter, in FIG. 9, the bonding film member 17, for which the openings 12 have been filled with cream solder 14 at step #2 in FIG. 13 which is carried out separately from step #1, is supplied at step #3 onto the remaining area of the circuit board 1, i.e., an area where an electronic component 9 with a small pitch of leads, i.e. electrodes, 10 is to be mounted. The cream solder 14 of the bonding film member 17 is positioned onto the conductive layers 7 of the circuit board 1 spaced in the land-shape. Then, as in FIG. 9, the leads 100 and 10 of the electronic components 90 and 9 are superposed with the cream solders 3 and 14 at step #4. Setting of the electronic components 90 and 9 is complete, and is followed by a reflow process.

Figure 11:
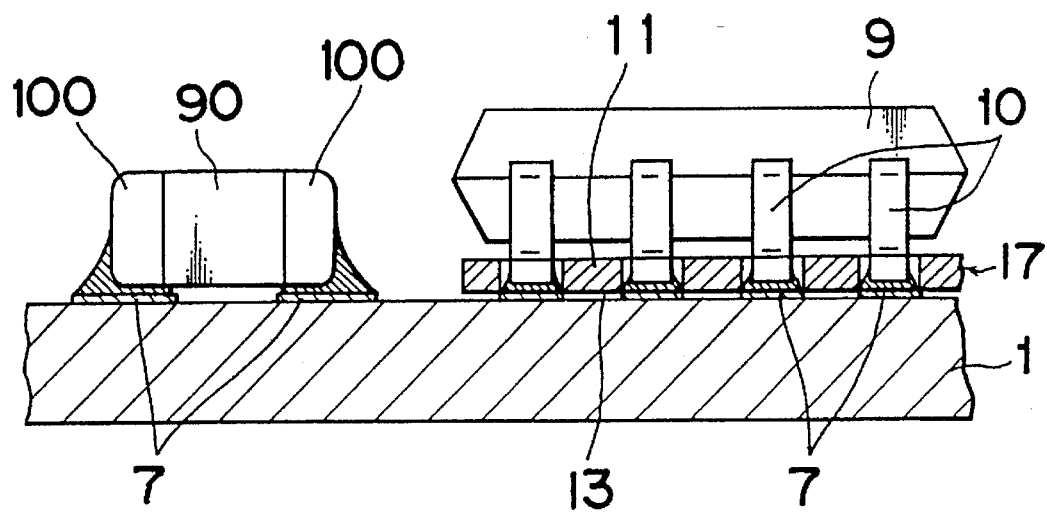
FIG. 11 is a side sectional view of the circuit board with the electronic components mounted thereon and after the reflow process is finished in FIG. 10.
Figure 15:
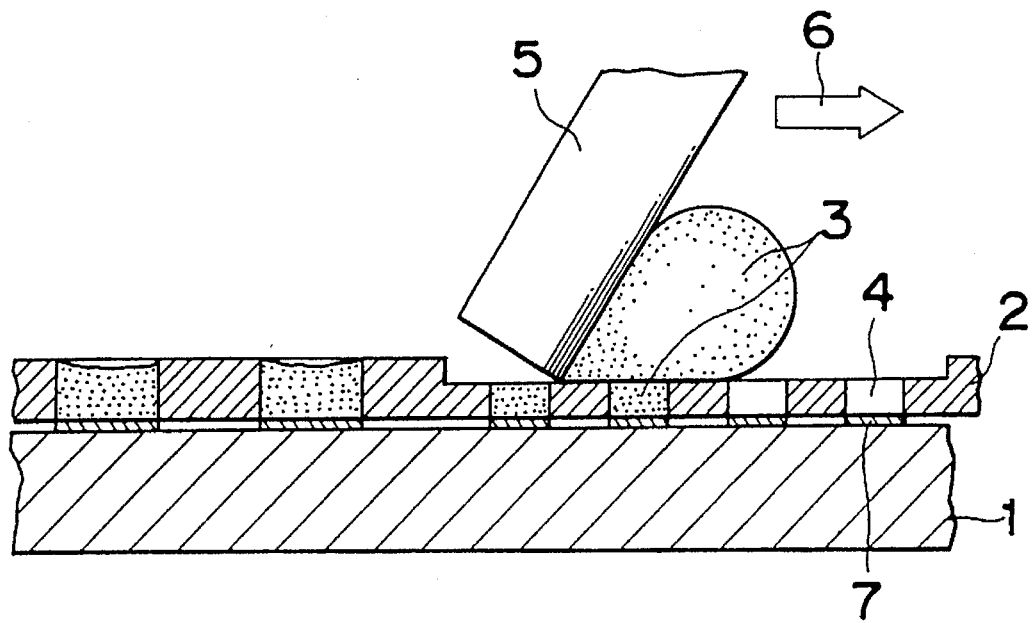
FIG. 15 is a side sectional view of a conventional printing process of cream solder.
Figure 12:
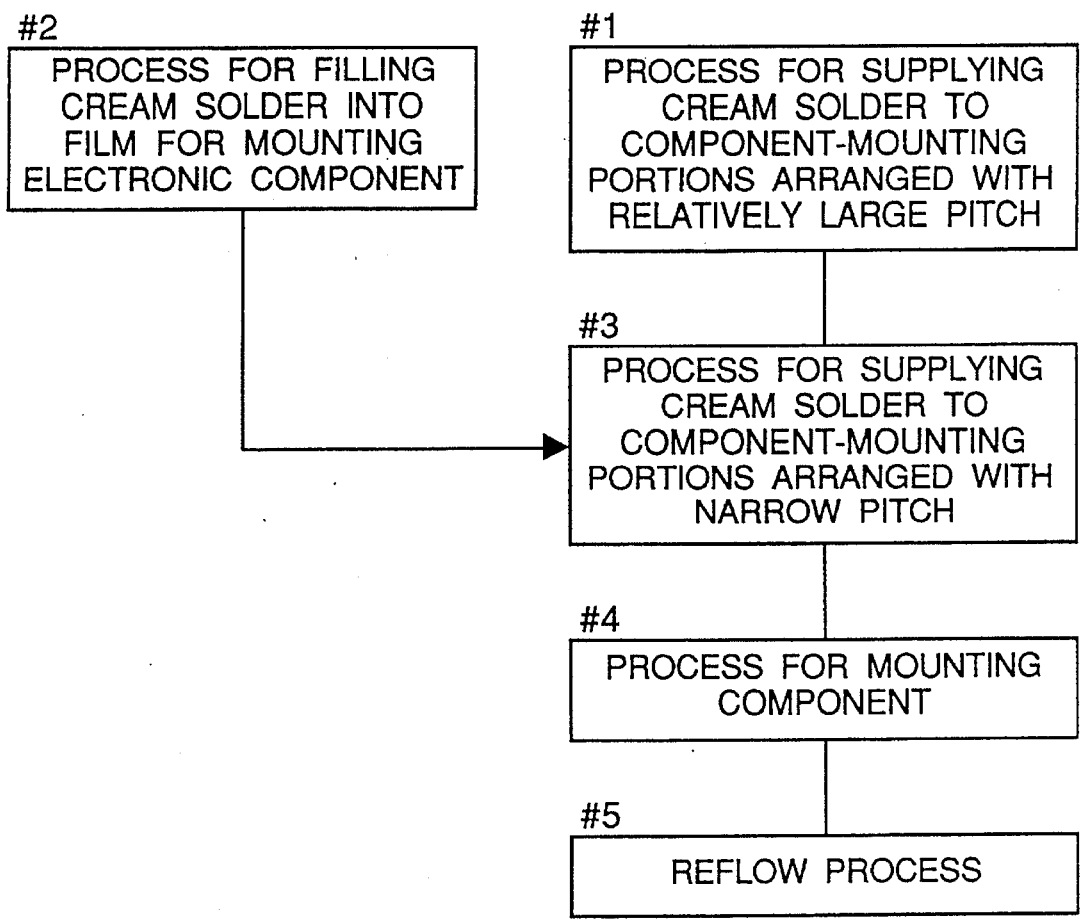
FIG. 12 is a flow chart showing the overall method of mounting electronic components on circuit boards according to the first embodiment of the present invention.

At step #5 in FIG. 12 in the reflow process indicated in FIG. 11, when the circuit board 1 is heated by a heat source such as hot wind or an infrared heater, etc., the flux sheet 13 and the cream solders 3 and 14 are sequentially melted, so that the electronic components 90 and 9 are mounted on the circuit board 1 as in FIG. 11.

Before explaining a modification of the method according to the embodiment, a flow chart is shown in FIG. 13 which indicates more concretely the steps of mounting the electronic component 9 with the electrodes 10 of the narrow pitch on the circuit board 1 in the method in FIG. 12. That is, step #2 in FIG. 12 corresponds to step #20 in FIG. 14 at which the bonding film member 17 is obtained by filling the bonding material 14 into the openings 12 of the film 11 and holding the bonding material 14 in the openings 12 by the flux layer 13. Step #3 in FIG. 12 corresponds to step #30 in FIG. 13 at which the bonding material 14 of the bonding film member 17 is overlayed onto the conductive layers 7 of the circuit board 1. Step #4 in FIG. 12 corresponds to step #40 in FIG. 13 at which the electrodes 10 of the components 9 are superposed onto the bonding material 14 of the bonding film member 17. Step #5 in FIG. 12 corresponds to step #50 in FIG. 13 at which the bonding material 14 is melted in the reflow process.

Figure 14:
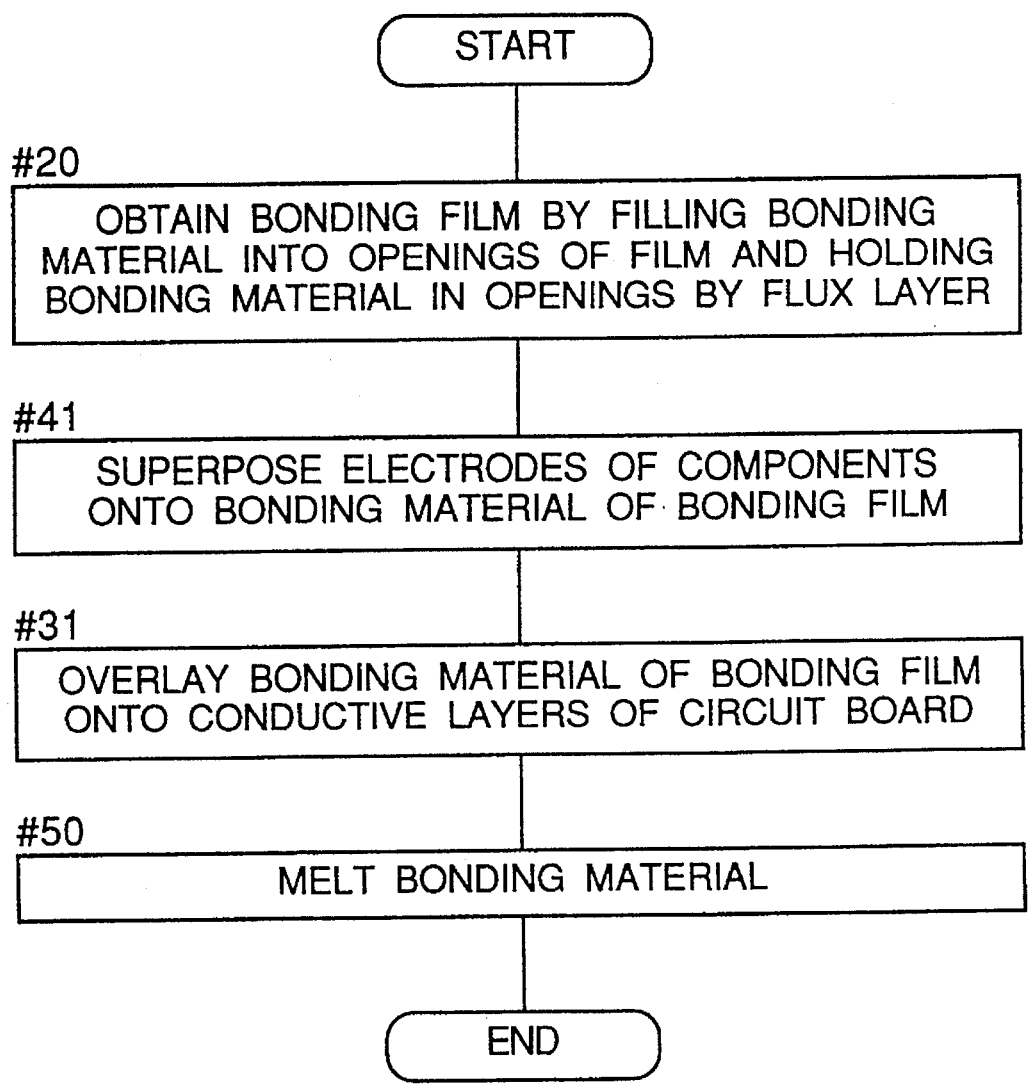
FIG. 14 is a flow chart showing a modification of the method of mounting the electronic component with the electrodes of the narrow pitch on the circuit board in the method in FIG. 12.
Figure 17:
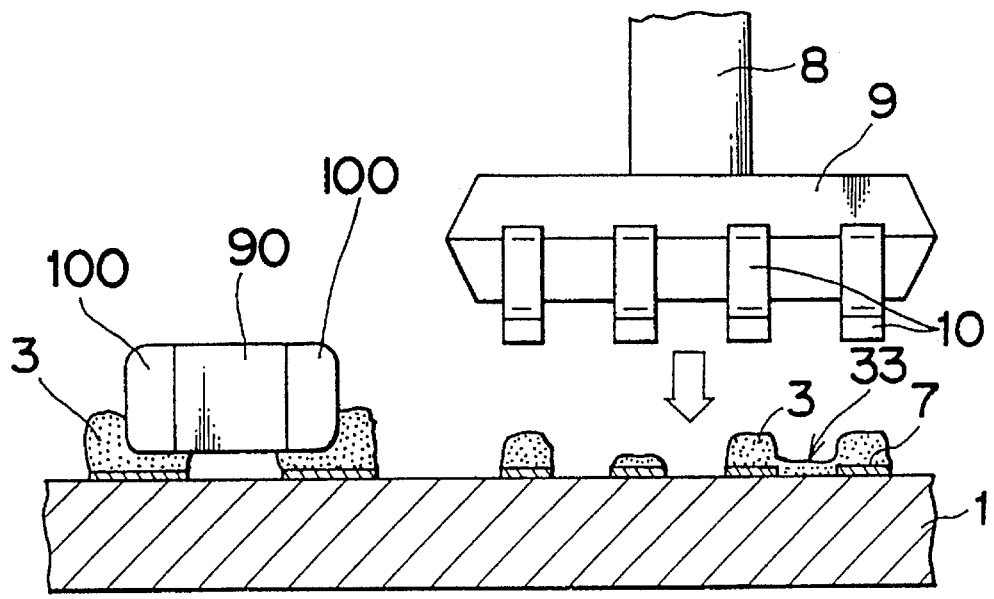
FIG. 17 is a side sectional view of a conventional mounting process of electronic components.
Figure 18:
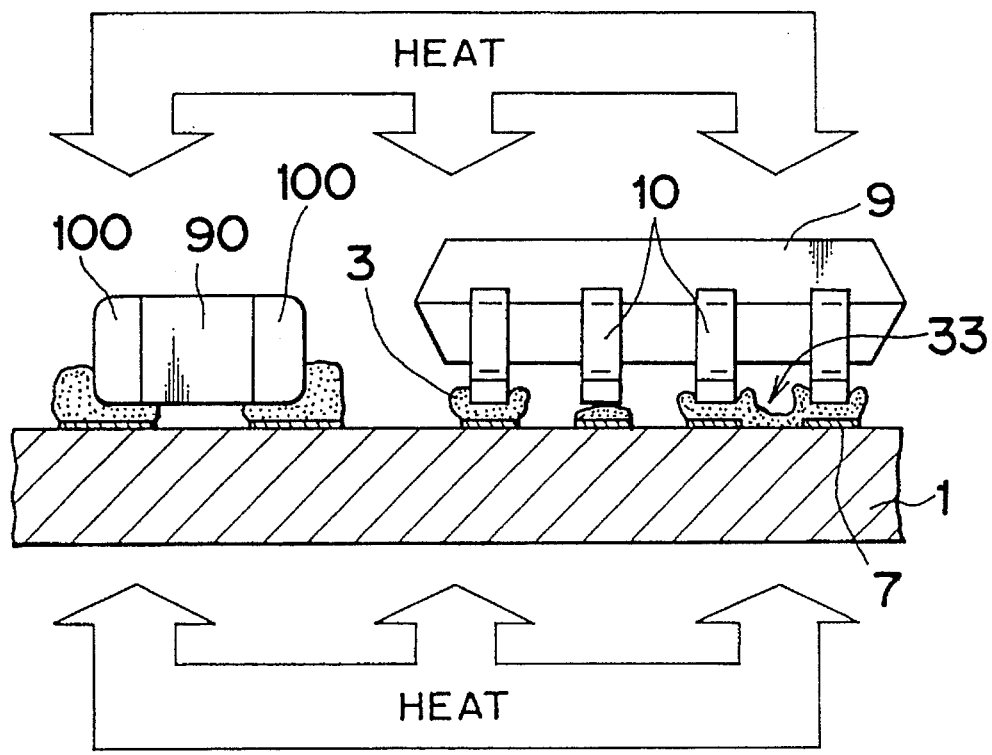
FIG. 18 is a side sectional view of a conventional reflow process.
Figure 19:
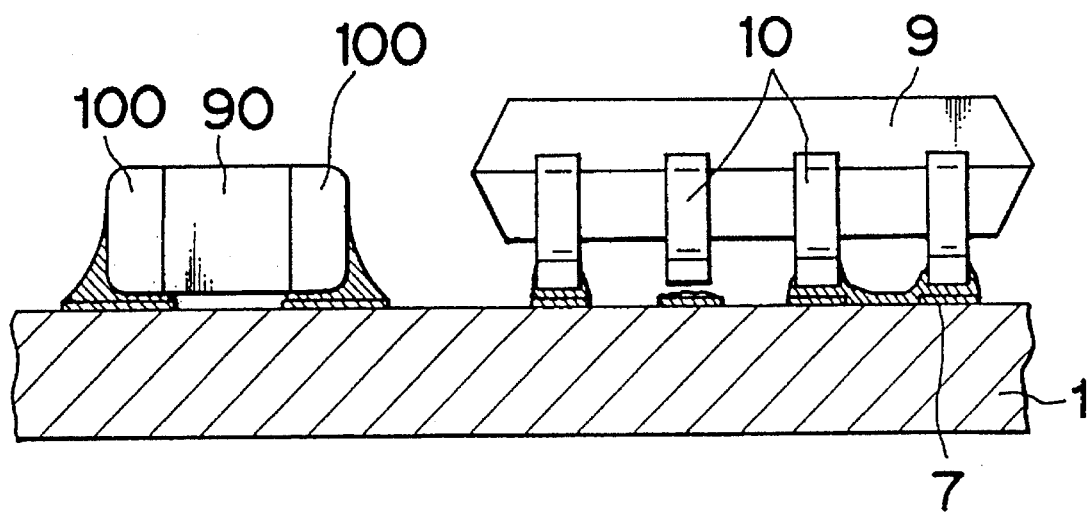
FIG. 19 is a side sectional view of the conventional circuit board with the electronic components mounted thereon.

In a modification of the method of the embodiment, as shown in FIG. 14, after the component 9 is attached to the bonding film member 17 with the use of the adhesion of the cream solder or adhesive agent for attaching the component 9 to the bonding film member 17, the bonding film member 17 with the component 9 is placed on the circuit board 1. That is, at step #41 after step #20 which is the same step as FIG. 13, the electrodes 10 of the component 9 are superposed onto the bonding material 14 of the bonding film member 17. Then, at step #31, the bonding material 14 of the bonding film member 17 with the component 9 is overlayed onto the conductive layers 7 of the circuit board 1. Then, at step #50 which is the same as FIG. 13, the circuit board 1 is heated to mount the components 900 and 9 thereon in the reflow process.

As described above, according to the present invention, it is enough only to lay the bonding film member on the circuit board to supply a predetermined amount of bonding material to a plurality of bonding parts. Moreover, since the film functioning also as a conventional mask remains permanently on the circuit board, such disadvantages that the bonding material is partially removed at the separating time of the mask, the bonding material invades the rear face of the mask, etc. are perfectly solved. Even when a suction nozzle presses the electronic component in the setting process, the deformed bonding material is prevented from spreading in the widthwise direction owing to the peripheral edges of the openings of the film. At the same time, sagging of the bonding material in the reflow process is also prohibited by the peripheral edges of the openings of the film. Therefore, shortcircuits as a result of overflowing of the bonding material or defective bonding due to the shortage of the solder can be suppressed to a minimum. Since the bonding film member can be cut in suitable sizes, a suitable amount of the bonding material is supplied to every kind of electronic component even when electronic components with electrodes of a narrow pitch and other electronic components mingle on the same circuit board.

Since the flux layer is layered on one surface of the bonding film member, a film face of the flux layer is formed at the bottom of the openings, making it easy to fill the bonding material into the openings and moreover enhancing the retaining efficiency of the filled bonding material. Further, the bonding film member obtained by filling bonding material into the openings bored in a predetermined pattern in the film is used as a feeding means of the bonding material. Therefore, a printing process of the bonding material which requires setting of a mask on the circuit board becomes unnecessary.

Furthermore, since a conventional printing method can be used jointly, when the bonding film member is supplied solely to the necessary area on the circuit board and the bonding material is printed according to the conventional method to the remaining area, a suitable amount of the bonding material can be supplied for each of many kinds of electronic components mixed on the same circuit board.

Although the present invention has been fully described in connection with the preferred embodiments thereof with reference to the accompanying drawings, it is to be noted that various changes and modifications are apparent to those skilled in the art. Such changes and modifications will be to be understood as included within the scope of the present invention as defined by the appended claims unless they depart therefrom.

What is claimed is:

1. A method of mounting electronic components on circuit boards, which comprises the steps of:

obtaining a bonding film member by filling bonding material into openings of an electrically-insulating and heat-proof film and holding the bonding material in the openings by providing a flux layer laminated on one surface of the film;

overlaying the bonding material of the bonding film member onto conductive layers of a circuit board by supplying, onto the circuit board, the bonding film member having said film with said openings thereof filled with said bonding material and having said flux layer laminated on said one surface of said film;

superposing electrodes of electronic components onto the bonding material of the bonding film member by supplying the electronic components onto the bonding film member; and melting the bonding material by heating the circuit board.

2. The mounting method as claimed in claim 1, wherein the bonding material is cream solder.

3. The mounting method as claimed in claim 1, wherein the film comprises a synthetic resin sheet.

4. The mounting method as claimed in claim 3, wherein material of the film has a heat-proof property to resist a melting temperature of the bonding material.

5. The method as claimed in claim 1, wherein said electronic components supplied onto the bonding film member include a first electronic component having electrodes of a first pitch and a second electronic component having electrodes of a second pitch narrower than said first pitch, the second electronic component is mounted on the circuit board through said obtaining, overlaying, and superposing steps, the first electronic component is mounted on said circuit board by the steps of:

supplying bonding material onto conductive layers of the circuit board; and superposing the electrodes of the first electronic component onto the bonding material disposed on the conductive layers of the circuit board by supplying the first electronic component onto the bonding material, and the first and second electronic components are subjected to the melting step after the first and second electronic components are superposed onto the bonding material of the circuit board.

6. The mounting method as claimed in claim 5, wherein the bonding material is cream solder.

7. The mounting method as claimed in claim 5, wherein the film is formed of synthetic resin sheet.

8. The mounting method as claimed in claim 7, wherein material of the film has a heat-proof property to resist a melting temperature of the bonding material.

9. A method of mounting electronic components on circuit boards, which comprises the steps of:

obtaining a bonding film member by filling bonding material into openings of an electrically-insulating and heat-proof film and holding the bonding material in the openings by providing a flux layer laminated on one surface of the film;

superposing electrodes of electronic components onto the bonding material of the bonding film member by supplying the electronic components onto the bonding film member;

overlaying the bonding material of the bonding film member onto conductive layers of a circuit board by supplying, onto the circuit board, the bonding film member, having said film with said openings thereof filled with said bonding material and having said flux layer laminated on said one surface of said film, together with the electronic components; and melting the bonding material by heating the circuit board.

10. The mounting method as claimed in claim 9, wherein the bonding material is cream solder.

11. The mounting method as claimed in claim 10, wherein the film comprises a synthetic resin sheet.

12. The mounting method as claimed in claim 11, wherein material of the film has a heat-proof property to resist a melting temperature of the bonding material.

13. The method as claimed in claim 9, wherein said electronic components supplied onto the bonding film member include a first electronic component having electrodes of a first pitch and a second electronic component having electrodes of a second pitch narrower than said first pitch, the second electronic component is mounted on the circuit board through said obtaining, superposing, and overlaying steps, the first electronic component is mounted on said circuit board by the steps of:

supplying bonding material onto conductive layers of the circuit board; and superposing the electrodes of the first electronic component onto the bonding material disposed on the conductive layers of the circuit board by supplying the first electronic component onto the bonding material, and the first and second electronic components are subjected to the melting step after the first and second electronic components are superposed onto the bonding material of the circuit board.

14. The mounting method as claimed in claim 13, wherein the bonding material is cream solder.

15. The mounting method as claimed in claim 13, wherein the film comprises a synthetic resin sheet.

16. The mounting method as claimed in claim 15, wherein material of the film has a heat-proof property to resist a melting temperature of the bonding material.

* * * * *